United States Patent [19]
> Hoshi et al.

[11] Patent Number: 5,830,630
[45] Date of Patent: Nov. 3, 1998

[54] LIGHT-SENSITIVE SHEET HAVING ALUMINUM ALLOY SUPPORT AND SILVER HALIDE LIGHT-SENSITIVE MATERIAL USING THE SAME

[75] Inventors: Satoshi Hoshi; Hirokazu Sakaki; Yoshinori Hotta, all of Shizuoka, Japan

[73] Assignee: Fuji Photo Film Co., Ltd., Kanagwa, Japan

[21] Appl. No.: 735,581

[22] Filed: Oct. 23, 1996

[30] Foreign Application Priority Data

Oct. 23, 1995 [JP] Japan ................................. 7-299227

[51] Int. Cl.$^6$ ........................................... G03C 1/77
[52] U.S. Cl. ................. 430/526; 430/523; 430/524; 430/525; 430/531; 430/627; 430/598
[58] Field of Search .................. 430/271.1, 275.1, 430/276.1, 278.1, 523, 524, 525, 526, 531, 627, 598

[56] References Cited

U.S. PATENT DOCUMENTS

| | | | |
|---|---|---|---|
| 4,092,169 | 5/1978 | Kumasaka | 430/526 |
| 4,640,886 | 2/1987 | Miller et al. | 430/531 |
| 4,647,346 | 3/1987 | Miller et al. | 430/278.1 |
| 4,853,093 | 8/1989 | Brenk et al. | 430/526 |
| 4,865,951 | 9/1989 | Huddleston et al. | 430/278.1 |
| 4,939,044 | 7/1990 | Ohashi et al. | 428/654 |
| 4,983,497 | 1/1991 | Gilson et al. | 430/278.1 |
| 5,122,443 | 6/1992 | Takeda | 430/523 |
| 5,290,659 | 3/1994 | Takeda | 430/203 |
| 5,393,651 | 2/1995 | Hoshi | 430/526 |

FOREIGN PATENT DOCUMENTS

| | | |
|---|---|---|
| 211574 | 2/1987 | European Pat. Off. . |
| 426192 | 5/1991 | European Pat. Off. . |
| 496127 | 7/1992 | European Pat. Off. . |
| 652298 | 5/1995 | European Pat. Off. . |
| 657559 | 6/1995 | European Pat. Off. . |
| 672759 | 9/1995 | European Pat. Off. . |
| 2057154 | 3/1981 | United Kingdom . |

*Primary Examiner*—Geraldine Letscher
*Attorney, Agent, or Firm*—Sughrue, Mion, Zinn, Macpeak & Seas, PLLC

[57] ABSTRACT

A light-sensitive sheet comprises an aluminum alloy support and a light-sensitive layer. The aluminum alloy support contains grains of secondary phase. The maximum grain size of the grains of secondary phase essentially is less than 5 $\mu$m. Silver halide light-sensitive materials having the aluminum alloy support are also disclosed.

10 Claims, 3 Drawing Sheets

LIGHT-SENSITIVE SHEET HAVING ALUMINUM ALLOY SUPPORT AND SILVER HALIDE LIGHT-SENSITIVE MATERIAL USING THE SAME

FIELD OF THE INVENTION

The present invention relates to a light-sensitive sheet having an aluminum alloy support. The invention also relates to a silver halide light-sensitive material comprising an aluminum alloy support and a silver halide light-sensitive layer.

BACKGROUND OF THE INVENTION

Aluminum is a light flexible metal, and is excellent in resistance to corrosion because an oxide film is formed on the surface of aluminum. An aluminum sheet is superior to a paper or a plastic film in durability. Accordingly, a light-sensitive material requiring durability (such as a presensitized printing plate) usually uses an aluminum sheet as a support.

Silver halide has a high sensitivity to light. Further, silver halide can be spectrally sesitized to adjust absorption to a wavelength of light within a wide range. Silver halide is one of the most excellent photo sensors.

Various light-sensitive materials have been proposed to enjoy the advantages of the aluminum support and the silver halide photo sensor.

The first proposed basic light-sensitive material has a simple structure comprising an aluminum support and a silver halide layer. The light-sensitive material is commercially available (Alphoto, Fuji Photo Film Co., Ltd.). The silver halide layer is formed by coating silver nitrate on the aluminum support and then coating a water soluble halide salt on the support. The light-sensitive material is imagewise exposed to light, and is developed in the same manner as in the conventional silver halide photography to form a black and white silver image on the aluminum support.

The second proposed light-sensitive material comprises an aluminum support, a light-sensitive resin layer and a silver halide light-sensitive layer in the order, which is disclosed in Japanese Patent Provisional Publication Nos. 54(1979)-27804 and 56(1981)-14239. A light-sensitive material comprising an aluminum support and a light-sensitive resin layer corresponds to a conventional presensitized printing plate. The second proposed light-sensitive material is prepared by coating a silver halide emulsion on the conventional presensitized printing plate. The proposed light-sensitive material has an advantage of using an excellent silver halide photo sensor in place of the conventional resin photo sensor. From another point of view, the second proposed light-sensitive material is prepared by integrating a conventional presensitized lithographic plate with a silver halide photographic material, which has been used as a contact lith film at the step of imagewise exposing the lithographic plate to light.

The third proposed light-sensitive material comprises an aluminum support, a silver halide layer (silver halide emulsion layer) and a physical development nucleating layer. The light-sensitive material is used in a silver complex salt diffusion transfer method. The light-sensitive material is disclosed in Japanese Patent Provisional Publication Nos. 56(1981)-9750, 63(1988)-260491 and 7(1995)-56351.

According to the silver complex salt diffusion transfer method, the light-sensitive material is imagewise exposed to light, and developed to react silver halide within the unexposed area with a silver halide chelating agent contained in a developing solution to form a silver complex salt. The silver complex is dissolved in the developing solution, and diffused and transferred to a physical development nucleating layer. The silver complex salt is reacted with a physical development nucleating agent, and is precipitated as silver image. The silver image can be used as a printing plate by using a difference between the silver image (relatively hydrophobic) in the physical development nucleating layer and the other area of the layer (relatively hydrophilic) in an affinity with dampening water or a lipophilic ink.

The fourth proposed light-sensitive material comprises an aluminum support and a light-sensitive hardening layer containing silver halide, a reducing agent and an ethylenically unsaturated polymerizable compound or an ethylenically unsaturated cross-linkable polymer. The light-sensitive material is disclosed in U.S. Pat. Nos. 4,859,568, 4,916,041 (European Patent No. 0267037B), U.S. Pat. No. 4,985,339 (European Patent No. 0298522B), U.S. Pat. No. 5,122,443 (European Patent No. 0426192B), U.S. Pat. Nos. 5,290,659 and 5,393,651 (European Patent No. 0636938B).

The light-sensitive material used in an image forming method comprising the steps of imagewise exposing to light a light-sensitive material, and developing the light-sensitive material to form a hardened image. At the developing step, the polymerizable compound is imagewise polymerized or the polymer is imagewise cross-linked by an oxidation radical of a reducing agent (including a radical formed from an oxidation product of a reducing agent). The light-sensitive material is preferably developed by a dry heat development, while the previously proposed light-sensitive materials have been developed with a developing solution. In the case that a reducing agent or an oxidation product thereof functions as a polymerization inhibitor, a polymerizable compound can be polymerized by a photo polymerization initiator or a thermal polymerization initiator. The image forming method using the fourth proposed light-sensitive material is hereinafter referred to as a silver halide polymerization method. The obtained hardened image can be used as a printing plate by converting a physical or chemical difference between the hardened area and the unhardened area into the difference in an affinity with a lipophilic ink. For example, the unhardened area on the hydrophilic surface of the aluminum support is removed to prepare a printing plate having a difference between the hydrophobic hardened image and the hydrophilic surface in an affinity with dampening water or a lipophilic ink.

The aluminum support is used not only in the above-mentioned silver halide light-sensitive materials but also in conventional presensitized printing plates. The conventional printing plates contain a photo polymerization or photo decomposition resin (e.g., a diazo resin, an o-quinonediazide resin, a photo sensitive azide composition) as a photosensor. The aluminum support has been researched and developed particularly in the technical fields of the conventional printing plates using a photosensitive resin. Prior art references disclosing an aluminum support used in the conventional printing plates are described below.

Japanese Patent Publication No. 47(1972)-5125 and U.S. Pat. Nos. 3,834,498 and 4,087,341 describe that the surface of the aluminum support may be treated to form a rough surface (graining treatment) or a hydrophilic surface. U.S. Pat. Nos. 2,098,627 and 3,860,426 and Japanese Patent Provisional Publication Nos. 60(1985)-149491 and 4(1992)-282637 describe that an intervening (undercoating) layer of a hydrophilic compound may be provided on the aluminum support to decrease stains in printed matters. The stains are caused by contamination of a light-sensitive layer within non-image area. Japanese Patent Provisional Publications Nos. 58(1983)-11759, 58(1983)-221254, 62(1987)-146694 and 62(1987)-148295 describe that the amounts of impurities in the aluminum support are preferably reduced to prevent the printed matters from ink stains. Examples of the impurities include silicon, copper and iron. The impurities attach ink to non-image area, which causes the ink stains.

Further, Japanese Patent Provisional Publication No. 7(1995)-138687 defines the size and number of grains of an intermetallic compound contained in an aluminum support of a lithographic plate to improve an effect of a graining treatment of the support. In more detail, the publication defines that the average size of the grains is in the range of 0.5 to 8 $\mu$m, and that the number of the grains is in the range of 500 to 100,000 per 1 mm$^2$, and that the number of the grains having the size of not smaller than 20 $\mu$m is not more than 2% of the total number of the grains.

SUMMARY OF THE INVENTION

The present inventors have studied silver halide light-sensitive materials having an aluminum support. The inventors have formed images on the light-sensitive materials according to the descriptions in the prior art references. As a result, fogs are observed within the unexposed area. The fogs are caused only in the silver halide light-sensitive materials using the aluminum support. The inventors have further noted that silver halide corrodes the aluminum support.

According to further study of the present inventors, a metal other than aluminum contained in an aluminum alloy sheet forms grains of secondary phase, such as grains of an intermetallic compound. The grains of secondary phase function as local cells in the substrate (primary phase) made of aluminum. It seems that a halide ion formed from silver halide starts the galvanic action of the local cells to cause corrosion of the aluminum support. Further, the grains of secondary phase might directly function as a catalyst in a fog development of silver halide.

Japanese Patent Provisional Publication Nos. 63(1988)-260491 (about a silver complex salt diffusion transfer method), 7(1995)-56351 (about a silver complex salt diffusion transfer method) and U.S. Pat. No. 5,393,651 (about a silver halide polymerization method) disclose means of solving the problem between silver halide and an aluminum support.

Japanese Patent Provisional Publication No. 63(1988)-260491 discloses an aluminum support of a presensitized lithographic plate wherein a ratio of the amount of anodic oxide (g·m$^{-2}$) to the surface roughness ($\mu$) is not less than 6. According to the descriptions in the publication, the corrosion can be prevented by adjustment of the surface roughness of the aluminum support and the anodic oxidation conditions appropriately.

Japanese Patent Provisional Publication Nos. 63(1988)-260491 discloses a presensitized lithographic plate having an aluminum support containing 500 or more pits per 100 $\mu$m$^2$ of the surface of the support. The pits have a diameter of 0.03 to 0.30 $\mu$m, and have an average diameter of 0.05 to 0.20 $\mu$m. The lithographic plate further contains a mercapto compound or a thion compound. The pit means a pore formed on a surface of an anodic oxide layer. The publication describes that a mercapto compound or a thion compound was added to a lithographic plate to prevent corrosion of an aluminum support. According to the invention disclosed in the publication, the mercapto or thion compound functions in the pit to form a transferred silver, which forms a minute dotted image of a high contrast.

U.S. Pat. No. 5,393,651 (European Patent No. 0636938B) proposes forming an undercoating layer containing a compound having a specific metal ion or a specific metal oxide ion on an anodic oxide layer of an aluminum support. The compound has a function of trapping a substance corroding aluminum and a function of preventing silver halide from fogging.

The above-mentioned disclosures of the publications solve the problem between silver halide and an aluminum support by improving an anodic oxide layer, an additive or an undercoating layer. The occurrences of the fog of silver halide and the corrosion of aluminum can be reduced according to the disclosures. However, the effects on silver halide and aluminum are indirect. It is difficult to solve the problem between silver halide and aluminum completely.

An object of the invention is to provide an aluminum alloy support that can be used in various light light-sensitive sheets including presensitized printing plates.

Another object of the invention is to provide a silver halide light-sensitive material that is substantially free from the problems of fog of silver and corrosion of aluminum.

The present invention provides a light-sensitive sheet comprises an aluminum alloy support and a light-sensitive layer, said aluminum alloy support containing grains of secondary phase, wherein the maximum grain size of the grains of secondary phase essentially is less than 5 $\mu$m.

The aluminum alloy support is preferably prepared by casting a melt of aluminum alloy while cooling the melt at a cooling rate of 100° to 10,000° C. per second.

The aluminum alloy support usually contains a metal other than aluminum, said metal being selected from the group consisting of silicon, iron, manganese, magnesium, chromium, zinc, bismuth, nickel and titanium.

The invention further provides a silver halide light-sensitive material comprising an aluminum alloy support and a silver halide light-sensitive layer, said aluminum alloy support containing grains of secondary phase, wherein the maximum grain size of the grains of secondary phase essentially is less than 5 $\mu$m.

The present invention is particularly effective in the following embodiments of the silver halide light-sensitive materials.

(II) A silver halide light-sensitive material comprising an aluminum alloy support, a light-sensitive resin layer and a silver halide light-sensitive layer in the order (III) A silver halide light-sensitive material comprising an aluminum alloy support, a silver halide light-sensitive layer and a physical development nucleating layer (silver complex salt diffusion transfer method)

(IV) A silver halide light-sensitive material comprising an aluminum alloy support and a silver halide light-sensitive hardening layer containing silver halide, a reducing agent, an ethylenically unsaturated polymerizable compound or an ethylenically unsaturated cross-linkable polymer (silver halide polymerization method)

According to the study of the present inventors, a relatively large grain size (5 $\mu$m or more) is necessary in order that the grains of secondary phase contained in the aluminum alloy support react with silver halide or function as cells. In other words, an interaction between small grains having a diameter of less than 5 $\mu$m and silver halide is very weak. Accordingly, the small grains do not take part in the occurrences of fog of silver halide and corrosion of aluminum.

The present invention proposes essentially restricting the diameter of the largest grain of secondary phase contained in an aluminum alloy support to less than 5 μm. The invention now completely solves the problem of an interaction between silver halide and aluminum. The same effect can also be obtained by using a pure aluminum support, which contains no grains of secondary phase. However, it is technically difficult to prepare a completely pure aluminum sheet. Further, a pure aluminum sheet is rather soft while a printing plate needs a hard support. Therefore, the present invention defines that there are substantially no grains of secondary phase having a diameter of not less than 5 μm provided that the support is made of an aluminum alloy containing the grains of secondary phase.

The aluminum alloy sheet can be prepared by casting a melt of aluminum alloy while cooling the melt at a cooling rate of 100° to 10,000° C. per second. According to a conventional process, a melt of aluminum has been cooled at a cooling rate of 1° to 10° C. per second. The particle size of secondary phase grains can be greatly decreased by cooling the melt at a high cooling rate of 100° to 10,000° C. per second.

Japanese Patent Provisional Publication No. 7(1995) 138687 defines that the number of the grains of an intermolecular compound (grains of secondary phase) having the size of not smaller than 20 μm is not more than 2% of the total number of the grains. Even if bulk grains of 20 μm or more were present in an aluminum support, the effect of the invention of the publication (improvement of an effect of a graining treatment) can be obtained provided that the number of the bulk grains is not more than 2% of the total number of the grains. In Examples of the publication, the bulk grains of 20 μm or more are contained in the aluminum support in an amount of 0.1 to 1.8% of the total number of the grains. Accordingly, the maximum size of the secondary phase grains contained in the aluminum support disclosed in the publication is 20 μm or more.

On the other hand, the present invention defines a severer condition to solve the problem of an interaction between silver halide and aluminum. The condition is that there are substantially no secondary phase grains having a diameter of not less than 5 μm. According to the present invention, an effect of a graining treatment is further improved, compared with the aluminum support of Japanese Patent Provisional Publication No. 7(1995)-138687. Therefore, the present invention has an additional effect that the aluminum support can be effectively grained to form a rough surface having uniformly

DETAILED DESCRIPTION OF THE INVENTION

[Aluminum alloy support]

The aluminum alloy support used in the present invention comprises aluminum (as a major component) and a metal other than aluminum (as a minor component). Examples of the metals other than aluminum include silicon, iron, manganese, magnesium, chromium, zinc, bismuth, nickel and titanium. The aluminum alloy sheet preferably contains the metal other than aluminum in an amount of 0.01 to 10 wt. %. In other words, the aluminum content in the aluminum alloy sheet is preferably in the range of 90 to 99.99 wt. %.

The various compositions of the aluminum alloy have been proposed. The conventional aluminum alloys (for example, AA (aluminum association) Nos. 1050, 1100, 1N30, 3103, 3005) can be used in the present invention.

An aluminum alloy sheet usually contains grains of secondary phase. The grains of the secondary phase include precipitates, crystals and grains of an intermetallic compound formed from aluminum and another metal. According to the present invention, the maximum grain size of the grains of secondary phase essentially is less than 5 μm. In other words, the aluminum alloy support substantially does not contain grains of secondary phase having a diameter of not less than 5 μm therein. In the present invention, the expression "the maximum grain size of the grains of secondary phase essentially is less than 5 μm" means that the number of the secondary phase grains having a diameter of not smaller than 5 μm is less than 0.1% of the total number of the secondary phase grains. The number of the secondary phase grains having a diameter of not smaller than 5 μm is preferably less than 0.01% of the total number of the grains.

The grain size of the secondary phase can be measured by grinding and etching a surface of an aluminum sheet, and observing or photographing the surface through a microscope. Aluminum supports used in conventional printing plates usually have bulk secondary phase grains having a diameter about 10 μm, which are randomly and frequently observed on the surface of the supports.

The grain size of the secondary phase predominantly depends on a cooling rate when an aluminum alloy sheet is prepared by casting a melt of aluminum alloy. A conventional aluminum alloy sheet has been prepared at a cooling rate of 1° to 10° C., at which secondary phase grains sufficiently glow into bulk grains having a diameter of not less than 5 μm. The particle size of the secondary phase grains can be greatly decreased by cooling the melt at a high cooling rate of 100° to 10,000° C. per second.

A melt can be cooled at a high cooling rate according to a continuous casting and rolling method.

Figure 4:
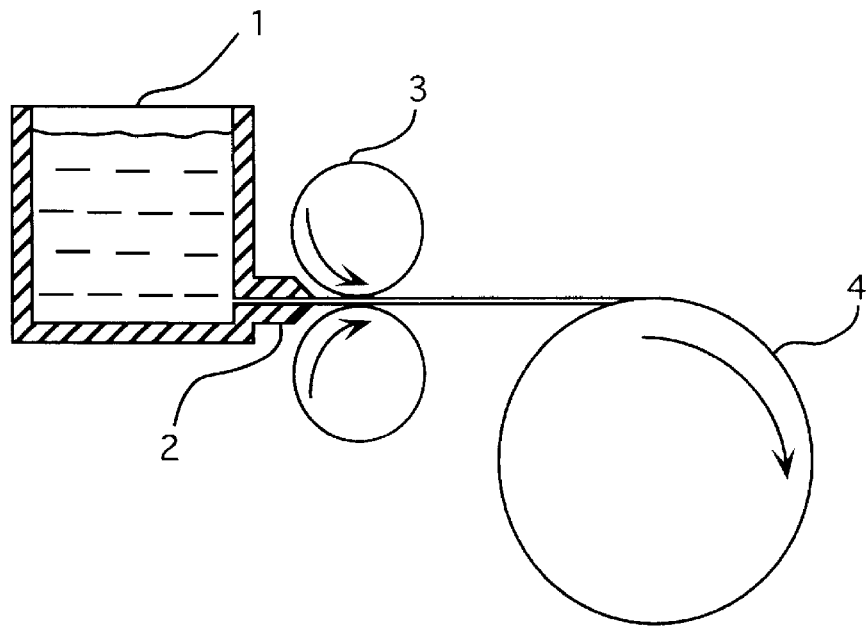
FIG. 4 is a sectional view schematically illustrating a continuous casting and rolling machine (roll type).
Figure 5:
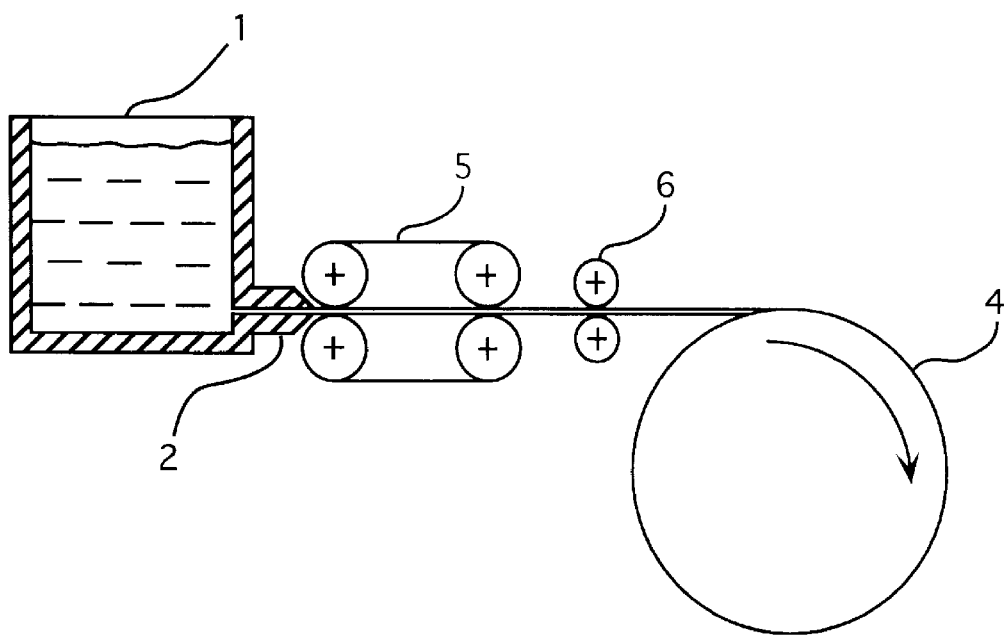
FIG. 5 is a sectional view schematically illustrating a continuous casting and rolling machine (belt type).

FIG. 4 is a sectional view schematically illustrating a continuous casting and rolling machine used in a roll type continuous casting and rolling method. As is shown in FIG. 4, a melt of an aluminum alloy contained in a furnace (1) is injected by a nozzle (2) into a mold formed by two rolls (3), which rotate clockwise and counterclockwise respectively. The melt is cooled by the rolls (3) to form a strip. The strip is coiled around a roll (4). The machine shown in FIG. 4 has been practically used according to a 3C method or a Hunter method FIG. 5 is a sectional view schematically illustrating a continuous casting and rolling machine used in a belt type continuous casting and rolling method. As is shown in FIG. 5, a melt of an aluminum alloy contained in a furnace (1) is injected by a nozzle (2) into a mold formed by two running belts (5). The melt is cooled by the belts (5) to form a strip. The strip is rolled through a thermal rolling device (6), and is coiled around a roll (4). The machine shown in FIG. 5 has been practically used according to a Hazelett method.

The roll type continuous casting and rolling method shown in FIG. 4 is preferred to the belt type method shown in FIG. 5, because the cooling rate of the former method is usually faster than the rate of the latter method. The melt can be cooled with rolls under high pressure to cool the melt more quickly. The cooling rate can also be adjusted by the nature and the temperature of a medium for cooling the casting and rolling machine.

The formed aluminum alloy sheet is usually subjected to a thermal treatment, such as a thermal rolling treatment or an annealing treatment. The aluminum alloy support has a thickness preferably in the range of 0.05 to 1 mm, and more preferably in the range of 0.1 to 0.6 mm.

At least one surface of the aluminum sheet is preferably subjected to a surface treatment described below. The other surface of the sheet can also be subjected to the surface treatment in a similar manner.

[Graining treatment]

The aluminum sheet is preferably treated to form a rough surface by a graining treatment. Before the graining treatment, the aluminum sheet can be degreased to remove a rolling oil from a surface of the sheet. The degreasing treatment can be conducted by using a surface active agent or an aqueous alkaline solution.

The graining treatment can be classified into a mechanical treatment and an electrochemical treatment. The mechanical graining treatments include a ball graining method and a brash graining method. According to the electrochemical graining treatment, a current passes through an aluminum sheet in an electrolytic solution of hydrochloric acid or nitric acid. Two or more graining treatments can be used in combination.

[Etching treatment]

The grained aluminum sheet is preferably chemically etched with an alkali or an acid. An alkali etching method is preferred to an acid etching method.

Examples of the alkali agents include sodium hydroxide, sodium carbonate, sodium aluminate, sodium metasilicate, sodium phosphate, potassium hydroxide and lithium hydroxide. The alkali solution preferably has a concentration in the range of 1 to 50 wt. %. The temperature of the alkali treatment is preferably in the range of 20° to 100° C. The treatment conditions are preferably so adjusted that the amount of the dissolved aluminum is in the range of 5 to 20 g/m$^2$.

The aluminum sheet is usually washed with an acid to remove smut from the surface after the alkali etching treatment. Examples of the acids include nitric acid, sulfuric acid, phosphoric acid, chromic acid, hydrofluoric acid and fluoroboric acid.

[Anodizing treatment]

The surface treated aluminum sheet can be subjected to an anodizing treatment.

In an anodizing treatment, an acid is used as an electrolyte to form a porous anodic oxide layer on the surface of the sheet. Examples of the acids include sulfuric acid, phosphoric acid, chromic acid, oxalic acid, sulfamic acid, benzenesulfonic acid and a mixture thereof.

The conditions of the anodizing treatment depend on the contents of the electrolytic solution. The concentration of the electrolytic solution is preferably in the range of 1 to 80 wt. %, the temperature of the solution is preferably in the range of 5° to 70° C., the current density is preferably in the range of 0.5 to 60 A/dm2, the voltage is preferably in the range of 1 to 100 v, and the time for the electrolysis is preferably in the range of 10 seconds to 50 minutes, and more preferably in the range of 10 to 100 seconds. The anodic oxide layer is formed preferably in an amount of not less than 1.0 g/m$^2$, and more preferably in the range of 2.0 to 6.0 g/m$^2$.

[Hydrophilic treatment]

The aluminum sheet can be subjected to a hydrophilic treatment. The hydrophilic treatment can be conducted by using an aqueous solution of an alkali metal silicate such as sodium silicate (described in U.S. Pat. Nos. 2,742,006, 3,181,461, 3,280,734 and 3,902,373), a potassium fluorozirconate (described in Japanese Patent Publication No. 36(1961)-22063) or a polyvinylphosphonic acid (U.S. Pat. No. 3,276,868). A treatment using an alkali metal silicate is particularly preferred.

The hydrophilic treatment can be conducted after a sealing treatment described below.

[Sealing treatment]

The aluminum sheet can be subjected to a sealing treatment to seal small pores on an anodic oxide layer. The sealing treatment can be conducted by a hydrating method, a metal salt method, an organic compound method or a coating method. The hydrating method is particularly preferred. According to the hydrating method, an anodic oxide layer on an aluminum sheet is exposed to water vapor under high pressure or boiling water to form aluminum hydrates such as bayerite or boehmite, which seals the pores of the anodic oxide layer. A water vapor hydrating method is further preferred.

According to a preferred water vapor hydrating method, an anodic oxide layer on an aluminum sheet is exposed to water vapor at a temperature of 70° to 270° C. under a water vapor pressure of not less than 100 Torr. The temperature is more preferably in the range of 75° to 170° C., and most preferably in the range of 80° to 130° C.

The treating time is determined by the temperature and the pressure. The treating time is usually in the range of 1 second to 30 minutes.

[Undercoating layer]

An organic undercoating layer can be provided on the aluminum support.

Examples of the organic components of the undercoating layer include polysaccharides (e.g., carboxymethyl cellulose, dextran, gum arabic), phosphonic esters (e.g., 2-aminoethyl phosphonate, phenyl phosphonate, naphthyl phosphonate, alkyl phosphonate, glycerophosphonic acid, methylene diphosphonate, ethylene diphosphonate), phosphoric esters (e.g., phenyl phosphate, naphthyl phosphate, alkyl phosphate, glycerophosphate), phosphinic esters (e.g., phenyl phosphinate, naphthyl phosphinate, alkyl phosphinate, glycerophosphinic acid), amino acids (e.g., glycine, β-alanine) and salts of hydroxyamines (e.g., sulfate salt of triethanolamine). Two or more organic components can be used in combination. The organic components are coated or adsorbed on a surface of the sheet to form an organic undercoating layer.

According to a coating method, the organic components are dissolved in a solvent to form a solution, and the solution is coated on an aluminum support and dried to form an undercoating layer. The solvent is water or an organic solvent (e.g., methanol, ethanol, methyl ethyl ketone). The concentration of the solution is preferably in the range of 0.005 to 10 wt. %. The solution can be coated according to a bar coating method, a rotational coating method, a spray coating method or a curtain coating method.

According to an adsorbing method, an aluminum support is immersed in the above-mentioned solution of the organic components to adsorb the components on the surface. The concentration of the solution is preferably in the range of 0.01 to 20 wt. %, and more preferably in the range of 0.05 to 5 wt. %. The temperature for the immersing procedure is preferably in the range of 20° to 90° C., and more preferably in the range of 25° to 50° C. The immersing time is preferably in the range of 0.1 second to 20 minutes, and more preferably in the range of 2 seconds to 1 minute.

An inorganic under coating layer containing a compound having a metal ion or a metal oxide ion (described in U.S. Pat. No. 5,393,651 and European Patent No. 0636938B) can be formed on an anodic oxide layer of an aluminum support.

[Silver halide light-sensitive materials]

The aluminum support of the present invention is particularly effective when the support is used in a silver halide light-sensitive material, which has a light-sensitive layer containing silver halide.

The silver halide light-sensitive materials can be classified into the following four embodiments.

(I) A silver halide light-sensitive material comprising an aluminum alloy support and a silver halide layer (II) A silver halide light-sensitive material comprising an aluminum alloy support, a light-sensitive resin layer and a silver halide light-sensitive layer in the order (III) A silver halide light-sensitive material comprising an aluminum alloy support, a silver halide light-sensitive layer and a physical development nucleating layer (IV) A silver halide light-sensitive material comprising an aluminum alloy support and a silver halide light-sensitive hardening layer containing silver halide, a reducing agent, an ethylenically unsaturated polymerizable compound or an ethylenically unsaturated cross-linkable polymer The four embodiments are described below in more detail.

[Light-sensitive material (I)]

The light-sensitive material (I) can be prepared by conducting a reaction of a water soluble silver salt (silver nitrate) with a water soluble halide salt on an aluminum support. The reaction is the same as in the preparation of a conventional silver halide emulsion.

An image can be formed in the same manner as in the conventional black and white silver halide photography.

[Light-sensitive material (II)]

The light-sensitive material (II) can be prepared by forming a light-sensitive resin layer on an aluminum support and coating a silver halide emulsion on the resin layer. The light-sensitive resin layer is the same as the layer used in a conventional presensitized lithographic plate.

Examples of the light-sensitive resins include diazo resins, o-quinonediazide compositions and photo sensitive azide compositions.

The diazo resin preferably is a reaction product of a diazonium salt with an organic condensing agent having a reactive carbonyl group such as aldol or acetal (for example, a condensation product of p-diazonium of diphenylamine with formaldehyde). The diazo resin is described in U.S. Pat. Nos. 1,667,415, 2,063,631, Japanese Patent Publication Nos. 47(1972)-1167, 48(1973)-48001, 49(1974)45322, and Japanese Patent Provisional Publication No. 56(1981)-121031.

The o-quinonediazide composition preferably contains an o-naphthoquionediazide compound. The o-quinonediazide composition is described in U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443.

The photo sensitive azide composition preferably comprises an azide compound and a water soluble or an alkaline soluble polymer. The composition also preferably comprises a polymer having an azido group and a binder polymer. The composition containing an azide compound is described in British Patent Nos. 1,235,281, 1,495,861, Japanese Patent Provisional Publication Nos. 51(1976)-32331 and 51(1976)-36128. The polymer having an azido group is described in Japanese Patent Provisional Publication Nos. 50(1975)-5102, 50(1975)-84302, 50(1975)-84303 and 53(1978)-12984.

The other light-sensitive resins can also be used in the light-sensitive material (II). The other resins include a polyester compound, a polyvinyl cinnamate and a photo polymer composition of photo polymerization type.

The coating amount of the light-sensitive resin is preferably in the range of 0.1 to 7 $g/m^2$, and more preferably in the range of 0.5 to 4 $g/m^2$.

The silver halide emulsion layer is formed by coating a silver halide emulsion on the light-sensitive resin layer, and drying the coated emulsion. The silver halide emulsion is described below in more detail with respect to the light-sensitive material (IV). The coating amount of silver halide is preferably in the range of 1 to 10 $g/m^2$, and more preferably in the range of 2 to 6 $g/m^2$.

At the first step of image formation, the silver halide emulsion layer is imagewise exposed to light, and developed in the same manner as in a conventional black and white silver halide photography to form a silver image. At the second step, the light-sensitive resin layer is uniformly exposed to light to sensitize the light-sensitive resin within the area where the silver image has not been formed. The exposure at the second step is larger than that at the first step because the sensitivity of light-sensitive resin is lower than the sensitivity of silver halide. At the third step, the silver halide emulsion layer and the unhardened area of the light-sensitive resin layer are removed from the light-sensitive material to form an image (printing plate).

[Light-sensitive material (III)]

The light-sensitive material (III) can be prepared by forming a layer containing silver halide and a physical development nucleating layer on an aluminum support. According to a conventional silver complex salt diffusion transfer process, a light-sensitive material usually comprises an aluminum support, a silver halide emulsion layer and a physical development nucleating layer in the order. On the other hand, a presensitized printing plate using an aluminum support usually comprises the support, a physical development nucleating layer and a silver halide emulsion layer in the order. The silver halide emulsion layer provided on the physical development nucleating layer is removed from the light-sensitive material after a silver image is formed on the nucleating layer.

The silver halide emulsion layer is formed by coating a silver halide emulsion on the nucleating layer or the support, and drying the coated emulsion. The silver halide emulsion is described below in more detail with respect to the light-sensitive material (IV).

The physical development nucleating layer contains a colloid of a metal (e.g., gold, silver, antimony, bismuth, cadmium, cobalt, palladium, nickel, lead, zinc) or a sulfide as a physical development nucleating agent. The nucleating layer usually further contains a binder.

According to a silver complex salt diffusion transfer method, the light-sensitive material is imagewise exposed to light to form a latent image of silver halide. The light-sensitive material is then developed with a developing solution containing a silver halide chelating agent to form a black silver image within the exposed area. The remaining silver halide within the unexposed area is reacted with the silver halide chelating agent to form a silver complex salt. The silver complex is dissolved in the developing solution, and diffused and transferred to a physical development nucleating layer. The silver complex salt is reacted with a physical development nucleating agent, and is precipitated as silver image.

Examples of the silver halide chelating agents include thiosulfuric salts, thiocyanic salts, aminethiosulfuric anhydrides and cyclic imides.

The formed silver image can be used as a printing plate by using a difference between the silver image in the physical development nucleating layer and the other area of the layer in an affinity with dampening water or a lipophilic ink. The silver image can be subject to a lipophilic treatment, if the affinity of the image to the ink is insufficient.

[Light-sensitive material (IV)]

The light-sensitive material (IV) comprises an aluminum alloy support and a silver halide light-sensitive hardening layer containing silver halide, a reducing agent, an ethylenically unsaturated polymerizable compound or an ethylenically unsaturated cross-linkable polymer. The silver halide light-sensitive hardening layer preferably comprises a hardening layer and a light-sensitive layer. The hardening layer contains the ethylenically unsaturated polymerizable compound or the ethylenically unsaturated cross-linkable polymer. The light-sensitive layer contains silver halide. The reducing agent can be contained in the hardening layer or the light-sensitive layer. The light-sensitive material can comprise three or more functional layers, namely the hardening layer, the light-sensitive layer and other functional layers. The other functional layers include an overcoating layer, an adhesive layer, a strippable layer and an intermediate layer.

Further, silver halide, a reducing agent and an ethylenically unsaturated polymerizable compound can be contained in light-sensitive microcapsules, which are dispersed in the silver halide light-sensitive hardening layer. U.S. Pat. Nos. 4,879,201 and 4,916,041 (European Patent No. 0267037B) disclose presensitized lithographic plates using the light-sensitive microcapsules.

The most preferred embodiment, namely a light-sensitive material having a hardening layer and a light-sensitive layer is described below in more detail.

[Hardening layer]

The hardening layer contains an ethylenically unsaturated polymerizable compound or an ethylenically unsaturated cross-linkable polymer. The hardening layer preferably has a thickness in the range of 0.1 to 20 $\mu$m, and more preferably in the range of 0.3 to 7 $\mu$m.

[Light-sensitive layer]

The light-sensitive layer contains silver halide. The light-sensitive layer forms a radical after an exposing step and a developing step. The formed radical is transferred to a hardening layer to cause a hardening reaction. The light-sensitive layer preferably has a thickness in the range of 0.1 to 20 $\mu$m, and more preferably in the range of 0.5 to 10 $\mu$m.

[Overcoating layer]

An overcoating layer has a function of preventing oxygen in the air from permeating into the hardening layer. Oxygen functions as a polymerization inhibitor. Accordingly, the hardness of the hardening layer can be improved by providing the overcoating layer. The overcoating layer can also function as a protective layer. The overcoating layer may contain a component (e.g., a base, a base precursor, a reducing agent, a heat development accelerator) that accelerates an image forming reaction.

The overcoating layer may contain a matting agent, which has a function of reducing adhesion on the surface of the light-sensitive material to prevent adhesion when two or more materials are stacked. The layer preferably has a thickness in the range of 0.3 to 20 $\mu$m, and more preferably in the range of 0.5 to 10 $\mu$m.

The overcoating layer is usually made of a hydrophilic polymer. The overcoating layer can also be formed by using a hydrophobic polymer. For example, the layer can be formed by dissolving a hydrophobic polymer in a solvent and coating the obtained solution on the light-sensitive material. The layer can also be formed by coating a latex of a hydrophobic polymer. If the overcoating layer is made of a hydrophobic polymer, the layer should be removed from the light-sensitive material between a heat development and an etching treatment.

[Adhesive layer]

An adhesive layer can be provided in the light-sensitive material to form a toner image. The adhesive layer contains a polymer, to which toner particles adhere.

The adhesive polymer preferably is a natural or synthetic rubber. Examples of the synthetic rubbers include polyisobutylene, nitryl rubber, butyl rubber, chlorinated rubber, polyvinyl isobutyl rubber, silicon elastomer, neoprene and a copolymer rubber (e.g., styrene-butadiene copolymer, styrene-isobutylene copolymer). The copolymer may be any of a random copolymer, a block copolymer and a graft copolymer.

The adhesive layer preferably has a thickness in the range of 0.01 to 10 $\mu$m, and more preferably in the range of 0.05 to 5 $\mu$m.

[Strippable layer]

A strippable layer can be provided in the light-sensitive material to form a transferred image.

The strippable layer is not adhesive at room temperature so that it is easily removed from the support. The layer is usually adhesive at an elevated temperature. The strippable layer usually contains an organic polymer (e.g., polyvinyl acetal resin, polyamide resin) as matrix. The matrix polymer preferably has a flow softening point that is higher than a heating temperature required for developing silver halide.

The strippable layer preferably contains a fluorine compound in an amount of not less than 1 wt. %. A fluorine surface active agent is preferably used as the fluorine compound. The strippable layer preferably has a thickness of not less than 1.0 $\mu$m, and more preferably of not less than 1.4 $\mu$m.

[Intermediate layer]

An intermediate layer can be provided between the layers. The intermediate layer can function as an antihalation layer or a barrier layer. The barrier layer prevents components from moving between layers when the light-sensitive material is stored. The composition of the intermediate layer is determined according to its function. The intermediate layer can be made of a hydrophilic polymer used in the light-sensitive layer or the overcoating layer.

The intermediate layer preferably has a thickness of not more than 10 $\mu$m.

[Silver halide]

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. Irregular forms and mixed forms as well as the above mentioned regular forms can used in the silver halide emulsions. Examples of the irregular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 μm. The grains may also be relatively large grains having a diameter of more 10 μm. The silver halide emulsion may be a polydispersed emulsion or a monodispersed emulsion. The monodispersed emulsion is described in U.S. Pat. Nos. 3,574,628, 3,655,394 and British Patent No. 1,413,748.

With respect to the crystal structure of the silver halide grains, the individual grains may have a homogeneous halogen composition or a heterogeneous halogen composition. In the heterogeneous composition, the composition varies from the outer surface portion to the inside portion. The grains may have a multi-layered structure. Further, the silver halide grains may be bonded with other silver halide grains having different halogen composition through epitaxial bonding. The grains may be bonded with compounds other than the silver halide such as silver rhodanate and lead oxide.

Various substances in the form of salt can be added to the silver halide. Examples of the substances include copper, thallium, lead, cadmium, zinc, chalcogens (e.g., sulfur, selenium, tellurium), gold, and noble metals of group VIII (e.g., rhodium, iridium, iron, platinum, palladium). The salts are added to the emulsion at the grain formation or after the grain formation according to a conventional process. The conventional process is described in U.S. Pat. Nos. 1,195,432, 1,191,933, 2,448,060, 2,628,167, 2,950,972, 3,488,709, 3,737,313, 3,772,031, 4,269,927 and Research Disclosure (RD), No. 13,452 (June 1975).

The silver halide grains can be doped with iridium ion by adding an aqueous solution of an iridium compound to a silver halide emulsion. Examples of water-soluble iridium compounds include hexachloroiridic(III) salts and hexachloroiridic(IV) salts. The silver halide grains can also be doped with rhodium ion by adding an aqueous solution of a rhodium compound to a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide. In the case that iridium compound and the rhodium compound are used in combination, the rhodium compound is preferably added to the emulsion before the addition of the iridium compound.

Two or more kinds of silver halide grains that differ in halogen composition, crystal habit, grain size, or other features from each other can be used in combination.

The silver halide is preferably used in the form of an emulsion. The silver halide emulsion can be prepared by known processes, which are described in Research Disclosure (RD), No. 17,643, pages 22 to 23 (December 1978), (Emulsion preparation and types); and Research Disclosure, No. 18,716, p. 648, (November 1979).

The silver halide emulsion is generally used after a physical ripening and a chemical sensitization. The silver halide grains preferably have a low fogging value.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

A supersensitizer can be added to the emulsion in addition to the sensitizing dye. The supersensitizer itself has neither a spectral sensitization effect nor an absorption of visible light, but shows a supersensitizing effect on the sensitizing dye.

[Organic metallic salt]

An organic metallic salt can be added to the light-sensitive layer containing silver halide. An organic silver salt is particularly preferred.

Examples of organic moieties of the salts include triazoles, tetrazoles, imidazoles, indazoles, thiazoles, thiadiazoles, azaindenes. An aliphatic, aromatic or heterocyclic compound having a mercapto group can also be used as the organic moiety. Further, silver carboxylates and acetylene silver can be used as the organic silver salt. Two or more organic metallic salts can be used in combination.

The organic silver salt is generally used in an amount of $10^{-5}$ to 10 mol, and preferably $10^{-4}$ to 1 mol based on 1 mol of silver halide. A similar effect can be obtained by adding the organic moiety of the organic metallic salt in place of the salt itself to the light-sensitive layer containing silver halide. The organic moiety can partially react with the silver halide to form the organic metallic salt.

[Reducing agent]

The reducing agent has a function of reducing the silver halide or a function of accelerating (or inhibiting) a hardening reaction of the polymerizable compound or the crosslinkable polymer. There are known various reducing agents having the functions. Examples of the reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

The reducing agents (including compounds referred to as developing agent or hydrazine derivative) are described in Japanese Patent Provisional Publication Nos. 61(1986)-183640, 61(1986)-183535, 61(1986)-228441, 62(1987)-70836, 61(1987)-86354, 62(1987)-86355, 62(1987)-206540, 62(1987)-264041, 62(1987)-109437, 63(1988)-254442, and Japanese Patent Application Nos. 63(1988)-97379, 63(1988)-296774, 63(1988)-296775, 1(1989)-27175, 1(1989)-54101 and 1(1989)-91162. The reducing agents are also described in T. James, The Theory of the Photographic Process, 4th edition, pages 291 to 334 (1977), Research Disclosure, Vol. 170, No. 17029, pages 9 to 15 (June 1978), and Research Disclosure, Vol. 176, No. 17643, pages 22 to 31 (December 1978). Further, a reducing agent precursor can be used as the reducing agent. The precursor (described in Japanese Patent Provisional Publication No. 62(1987)-210446) can release a reducing agent under heating or in contact with a base.

When the reducing agent is basic, that is, it forms a salt with an acid, the reducing agent can be used in the form of a salt with an acid. The reducing agents can be used singly or in combination. Certain interactions between those reducing agents may be expected where two or more reducing agents are used in combination. One of the interactions is for an acceleration of reduction of silver halide (or an organic silver salt) through so-called super-additivity. The other interaction is for a chain reaction between an oxidant of one reducing agent formed by a reduction of silver halide (or an organic silver salt) oxidation-reduction reaction and another reducing agent. The chain reaction induces or inhibits the polymerization of the polymerizable compound. Both interactions may occur simultaneously. Thus, it is difficult to determine which of the interactions has occurred in practical use.

The reducing agent is used in an amount of 0.1 to 10 mol, and more preferably 0.25 to 2.5 mol based on 1 mol of silver halide.

By adjusting the kind or amount of the above reducing agent, the polymerizable compound or the cross-linkable polymer can be hardened within the area where a latent image of the silver halide has been formed.

The reducing agent itself can be oxidized to form an oxidation product when the reducing agent develops silver halide. In the case that the oxidation product is decomposed in the layer to form a radical, a polymerization reaction proceeds within the area where the latent image of silver halide has been formed. In this system, hydrazines are preferably used as the reducing agent.

On the other hand, the reducing agent itself or the oxidation product may have a function of inhibiting the polymerization. In this case, the oxidation product substantially does not form a radical. A polymerization is caused by a polymerization initiator within the area where the latent image of silver halide has not been formed (in the case that the inhibiting function of the oxidation product is stronger than that of the reducing agents) or has been formed (in the case that the inhibiting function of the reducing agent is stronger than that of the oxidation products). In these systems, 1-phenyl-3-pyrazolidones and hydroquinones are preferably used as the reducing agent. Further, the following polymerization initiator should be contained in the light-sensitive material of these systems.

[(Polymerization initiator]

A thermal polymerization initiator forms a free radical by heat. The thermal polymerization initiator is described in Addition Polymerization and Ring Opening Polymerization, pages 6 to 18, edited by the Editorial Committee of High Polymer Experimental Study of the High Polymer Institute, published by Kyoritsu Shuppan (1983) and Japanese Patent Provisional Publication No. 61(1986)-243449. Examples of the thermal polymerization initiators include: azo compounds such as azobisisobutyronitrile, 1,1-azobis(1-cyclohexanecarbonitrile), dimethyl-2,2'-azobisisobutyrate, 2,2-azobis(2-methylbutyronitrile) and azobisdimethylbaleronitrile; organic peroxides such as benzoyl peroxide, di-t-butyl peroxide, dicumyl peroxide, t-butyl hydroperoxide and cumene hydroperoxide; inorganic peroxides such as hydrogen peroxide, potassium persulfate and ammonium persulfate; and sodium p-toluenesulfinic acid.

The photopolymerization initiator is described in Oster et al., Chemical Review, vol. 68, pages 125 to 151 (1968) and Kosar, Light-Sensitive System, pages 158 to 193, John Wiley & Sons (1965). Examples of the photopolymerization initiator include carbonyl compounds (e.g., α-alkoxyphenyl ketones, polycyclic quinones, benzophenone derivatives, xanthones, thioxanthones and benzoines), halogen-containing compounds (e.g., chlorosulfonyl or chloromethyl polynuclear aromatic compounds, chlorosulfonyl or chloromethyl heterocyclic compounds, chlorosulfonyl or chloromethyl benzophenones and fluorenones), haloalkanes, α(-halo-α-phenylacetophenones, redox couples of photoreducible dye and reducing agent, organic sulfur compounds, peroxides, photo semi-conductors (e.g., titanium dioxide and zinc oxide), metallic compounds (e.g., ferrous salt, metallic salt of carbonyl compound, metal complex and uranyl salt), silver halide, azo compounds and diazo compounds. The photopolymerization initiators are commercially available (such as Irgaqure 651, 907, Ciba Geigy).

Concrete examples of the photopolymerization initiators include 2-dimethoxy-2-phenylacetophenone, 2-methyl-[4-(methylthio)phenyl]-2-morpholino-1-propanone, benzoin butyl ether, benzoinisopropyl ether, benzophenone, Michler's ketone, 4,4-diethylaminobenzophenone, chloromethylbenzophenone, chlorosulfonylbenzophenone, 9,10-anthraquinone, 2-methyl-9,10-anthraquinone, chlorosulfonyl anthraquinone, chloromethyl anthraquinone, 9,10-phenanthrenequinone, xanthone, chloroxanthone, thioxanthone, chlorothioxanthone, 2,4-diethylthioxanthone, chlorosulfonylthioxanthone, chloromethylbenzothiazole, chlorosulfonylbenzoxazole, chloromethylquinoline, fluorene and carbon tetrabromide.

The polymerization initiator is used in an amount of preferably 0.001 to 0.5 g, and more preferably 0.01 to 0.2 g based on 1 g of the total amount of the polymerizable compound and the cross-linkable polymer.

[Polymerizable compound]

The polymerizable compound used in the present invention has an ethylenically unsaturated group.

Examples of the ethylenically unsaturated polymerizable compounds include acrylic acids, salts of acrylic acids, acrylic esters, acrylamides, methacrylic acids, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof. Acrylic esters and methacrylic esters are preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxy acrylate, nonylphenyloxyethyl acrylate, 1,3-dioxolane acrylate, hexanediol diacrylate, butanediol diacrylate, neopentyl glycol diacrylate, trimethylolpropane triacrylate, tricyclodecanedimethylol diacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxanediacrylate, 2-(2-hydroxy-1,1-dimethylethyl)-5,5-dihydroxymethyl-1,3-dioxanetriacry late, triacrylate of propylene oxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentyl glycol dimethacrylate, trimethylolpropane trimethacrylate, pentaerythritol trimethacrylate, pentaerythritol tetramethacrylate and dimethacrylate of polyoxyalkylenated bisphenol A.

[Cross-linkable polymer]

The cross-linkable polymer used in the present invention has an ethylenically unsaturated group that is reactive to a radical. The polymer may be a homopolymer or a copolymer with a monomer that does not have a reactive group.

The cross-linkable polymer preferably is a polymer having a double bond in a main chain or a side chain of its molecule, to which a radical (a polymerization initiator radial or a growing radical at polymerization reaction of a polymerizable compound) can be added.

The polymer is described in Japanese Patent Provisional Publication No. 64(1990)-17047. Examples of the polymers include: a polymer having an ethylenically unsaturated double bond in its side chain (e.g., a homopolymer or a copolymer of allyl (meth)acrylate, 1,2-polybutadiene, 1,2-polyisoprene); a polymer having an unsaturated double bond in its main chain (e.g., poly-1,4-butadiene, poly-1,4-isoprene and copolymers thereof); and a natural or synthetic rubber.

In the case that an alkaline solution is used to remove the unhardened area, the cross-linkable polymer preferably contains an acidic functional group in its molecule. Examples of the acidic functional groups include carboxyl, an acid anhydride group, phenolic hydroxyl, sulfo, sulfonamido and sulfonimido. Examples of the acidic monomers include acrylic acid, methacrylic acid, styrene-sulfonic acid and maleic anhydride. The amount of the monomer having the acidic functional group is preferably in the range of 1 to 50 mol %, and more preferably in the range of 5 to 30 mol %.

The polymerizable monomer and the cross-linkable polymer can be used singly or in combination of two or more monomers or polymers.

The polymerizable monomer and the cross-linkable polymer is preferably contained in the polymerizable layer in an amount of 3 to 90 wt. % based on the total amount of the polymerizable layer. The amount is more preferably in the range of 15 to 60 wt. %.

[Binder of hardening layer]

A binder may be added to the hardening layer of the light-sensitive material to enhance the strength of the layer. Various natural or synthetic polymers can be used as the binder. The above-mentioned cross-linkable polymer can also function as the binder.

The synthetic polymer can be formed by an addition reaction or a condensed reaction. The synthetic polymers of the addition reaction type include various vinyl polymers including homopolymers and copolymers. Examples of the condensed polymers include polyesters, polyamides, polyurethanes and polyester-polyamides.

In the case that an alkaline solution is used to remove the unhardened area, the binder polymer preferably contains an acidic functional group in its molecule. Examples of the acidic functional groups include carboxyl, an acid anhydride group, phenolic hydroxyl, sulfo, sulfonamido and sulfonimido. Examples of the acidic monomers include acrylic acid, methacrylic acid, styrenesulfonic acid and maleic anhydride. The amount of the monomer having the acidic functional group is preferably in the range of 1 to 50 mol %, and more preferably in the range of 5 to 30 mol %.

The binder polymer preferably is a cross-linkable acidic polymer. An example of the cross-linkable acidic polymer is a copolymer of allyl (meth)acrylate with (meth)acrylic acid.

An image can be obtained only using a cross-linkable polymer, such as a polymer having an ethylenically unsaturated side chain. However, an ethylenically unsaturated polymerizable compound is used to form a hard polymer image. Further, an image can also be obtained only using the ethylenically unsaturated polymerizable compound. However, the polymerizable compound is usually in the form of liquid. Accordingly, a binder polymer is preferably added to a polymerizable layer to obtain an appropriate hardness of the layer.

The amount of the binder is usually not more than 80 wt. %, and preferably not more than 70 wt. % based on the total amount of the polymerizable layer.

[Hydrophilic polymer]

A hydrophilic polymer is preferably added as a binder to a hydrophilic layer, such as a light-sensitive layer and an overcoating layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer that swells in water has an affinity with water, but is not soluble in water because of the cross-linking structure of the polymer.

The natural or synthetic polymers can be used as the hydrophilic binder.

Examples of the natural hydrophilic polymer include polysaccharide such as starch derivatives, cellulose derivatives, alginic acid, pectic acid, gum arabic and pullulan, and protein such as casein and gelatin. The denatured polymers can also be used. In preparation of the light-sensitive material (at the stage of coating or drying), these natural polymers may be denatured or crosslinked.

The synthetic hydrophilic polymer is a polymer or copolymer of water-soluble monomers. The examples of the hydrophilic polymer include polyvinyl alcohol, polyvinyl ether, polyvinyl pyrrolidone and derivatives thereof. Polyvinyl alcohol is particularly preferred.

Polyvinyl alcohol preferably has a high saponification degree of not less than 70%, more preferably of not less than 80%, most preferably of not less than 95%. The polyvinyl alcohol having the high saponification degree has a very low transmission coefficient of oxygen.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl metharcrylate and acrylamide.

Polyvinyl alcohol may also be denatured after the saponification. Hydroxyl in polyvinyl alcohol can be modified by etheration, esterification or acetylation.

A cross-linked polyvinyl alcohol can also be used. Examples of the cross-linking agents include aldehyde, methylol compounds, diisocyanate, divinyl compounds, dicarboxylic acids and inorganic agents (e.g., borates, titanium and copper).

The molecular weight of the hydrophilic polymer is preferably in the range of 3,000 to 500,000. The hydrophilic polymer binder is preferably used in an amount in the range of 0.05 g to 20 g/m$^2$, and more preferably in the range of 0.1 to 10 g/m$^2$.

Gelatin can be used in combination with another hydrophilic polymer in a light-sensitive layer containing silver halide. In this case, the difference between the pH value of the layer and the isoelectric point of the gelatin is preferably larger than 1.2.

[Base or base precursor]

The light-sensitive material preferably contains a base or base precursor.

Various organic or inorganic bases and their precursors (e.g., decarboxylation type, thermal decomposition type, reaction type and complex salt-formation type) can be used in the light-sensitive material.

Inorganic bases are described in Japanese Patent Provisional Publication No. 62(1987)-209448. Examples of the organic bases include tertiary amine compounds (described in Japanese Patent Provisional Publication No. 62(1987)-170954), bisamidine compounds, trisamidine compounds or tetraamidine compounds (described in Japanese Patent Provisional Publication No. 63(1988)-316760) and bisguanidine compounds, trisguanidine compounds or tetraguanidine compounds (described in Japanese Patent Provisional Publication No. 64(1989)-68746). In the present invention, a base having a pKa value of not less 7 is preferred.

In the present invention, a base precursor is preferred to the base from the viewpoint of the storage stability of the light-sensitive material.

Preferred examples of the base precursors include salts of organic acids with bases that is decarboxylated under heating and urea compounds which release bases under heating. Examples of the reaction mechanisms of the base precursor include a reaction between the base precursor and a salt containing anion having higher compatibility with transition metal acetylide or transition metal ion than acetylide anion, and a reaction of introducing into water both of a basic metallic compound which is hardly dissolved in water and a compound capable of reacting with metal ion of the basic metallic compound in a water medium to form a complex salt so as to release a base through a reaction between those two compounds in the presence of water.

The base precursor preferably releases a base at a temperature in the range of 50° to 200° C., and more preferably in the range of 80° to 160° C.

The base or the base precursor can be used in an amount of preferably 0.1 to 20 mol, and more preferably 0.2 to 10 mol based on 1 mol of silver halide.

[Heat development accelerator]

The light-sensitive material can contain a heat development accelerator. The heat development accelerator may be contained in any layers of the light-sensitive material. The heat development accelerator has a function of increasing the plasticity of a polymer (contained in the hardening layer or the light-sensitive layer). The accelerator has another function of accelerating the dispersion of the components in the layers when it is dissolved by heat of the development process.

The heat development accelerator has been known as a plasticizer. The known plasticizers are described in Plastic Additives (written in Japanese), pages 21 to 63 (Taisei-sha); Plastics Additives, Second Edition; Hanser Publishers, Chapter 5, pages 251 to 296; Thermoplastic Additives, Marcel Dekker Inc., Chapter 9, pages 345 to 379; Plastic Additives, An Industrial Guide, Noyes Publications, Section 14, pages 333 to 485: The Technology of Solvents and Plasticizers, John Wiley & Sons, Inc., Chapter 15, pages 903 to 1027; Industrial Plasticizers, Pergamon Press; Plasticizer Technology, Vol. 1, Reinhold Publishing corp.; and Plasticization and Plasticizer Process, American Chemistry.

Examples of the heat development accelerator include glycols (e.g., diethylene glycol, dipropylene glycol), polyhydric alcohols (e.g., glycerol, butanediol, hexanediol), saccharides, formates, ureas (e.g., urea, diethylurea, ethyleneurea, propyleneurea), a urea resin, a phenol resin, amides (e.g., acetamide, propionamide) and sulfonamides. Two or more heat development accelerators can be used in combination. The heat development accelerators can be added to two or more layers of the light-sensitive material.

The amount of the heat development accelerator is preferably in the range of 0.05 to 2 g/m$^2$, and more preferably in the range of 0.1 to 1 g/m$^2$.

[Colorant]

The light-sensitive material may contain a colorant. The colorant can functions as an antihalation or antiirradiation dye. Further, a hardened image can be colored by the colorant. Various known dyes and pigments can be used as the colorant provided that the colorant does not affect the sensitivity and the developing reaction of silver halide. The colorant can be contained in the polymerizable layer in the case that the colorant is used to function as an antihalation dye or to color a hardened image. The colorant can also be contained in the light-sensitive layer in the case that the colorant is used to function as an antiirradiation dye. The hue of the antihalation or antiirradiation dye is preferably adjusted within the sensitive light region of silver halide.

The pigments are commercially available. Further, pigments are described in various publications such as Handbook of Color Index, New Handbook of Pigments, (Nippon Ganryo Gijutsu Kyokai (edition), 1977), New Applied Technique of Pigments, (CMC Publishing, 1986), and Technique of Printing Ink, (CMC Publishing, 1984).

Examples of the pigments include black pigments, yellow pigments, orange pigments, brown pigments, red pigments, violet pigments, blue pigments, green pigments, fluorescent pigments, metal powder pigments and polymer pigments. Concrete examples of the pigments include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxadine pigments, isoindolinone pigments, quinophthalone pigments, dye-type lake pigments, azine pigments, nitroso pigments, nitro pigments, natural pigments, fluorescent pigments and inorganic pigments.

The pigment can be itself used or can be used after being subjected to surface treatment. The surface treatments include a method of coating a resin or wax on the surface, a method of depositing a surface active agent thereon and a method of bonding a reactive substance to the surface. Examples of the reactive substances include silane coupling agent, epoxy compound and polyisocyanate. Those methods are described, for example, in Nature and Application of Metal Soap, (Saiwai Shobo), Technique of Printing Ink, (CMC Publishing, 1984), and New Applied Technique of Pigments, (CMC Publishing, 1986).

The particle size of the pigment is preferably in the range of 0.01 to 10 $\mu$m, and more preferably in the range of 0.05 to 1 $\mu$m. Various conventional dispersing techniques for ink or toner can be used for dispersing the pigment in a coating solution of the polymerizable layer. Examples of dispersing devices include a sand mill, an attritor, a pearl mill, a super mill, a ball mill, an impeller, a disperser, a KD mill, a colloid mill, a dyatron, a three-roll mill and a press kneader. The details are described in New Applied Technique of Pigments, (CMC Publishing, 1986).

The dyes are described in "Handbook of Dyes," Yuki Kagaku Kyokai (edition), 1970. Examples of the dyes include azo dyes, metal complex salt azo dyes, pyrazolone azo dyes, anthraquinone dyes, quinonimine dyes and methine dyes.

The antiirradiation dyes are described in Japanese Patent Publications No. 41(1966)-20389, No. 43(1968)-3504, No. 43(1968)-13168, Japanese Provisional Publications No. 2(1990)-39042, U.S. Pat. No. 2,865,752, U.S. Pat. No. 3,423,207, U.S. Pat. No. 3,697,037, and British Patents No. 1,030,392, No. 1,100,546.

The amount of the colorant is usually in the range of 0.01 to 2 g/m$^2$, and preferably in the range of 0.05 to 1 g/m$^2$.

[The other additives]

The light-sensitive material can contain the other additives such as an antifogging agent, a silver development accelerator and a stabilizer. Examples of these compounds include azoles, azaindenes, nitrogen-containing carboxylic acids, phosphoric acids, acetylene compounds and sulfonamides. The azoles and the azaindenes are described in Research Disclosure pages 24 to 25 (1978). The nitrogen-containing carboxylic acids and the phosphoric acids are described in Japanese Patent Provisional Publication No. 59(1984)-168442. The acetylene compounds are described in Japanese Patent Provisional Publication No. 62(1987)-87957. The sulfonamides are described in Japanese Patent Provisional Publication No. 61(1987)-178232.

An aromatic (having a carbon or heterocyclic ring) mercapto compound can also be used as an antifogging agent or a development accelerator. An aromatic heterocyclic mercapto compound, particularly a mercapto triazole derivative is preferred. The mercapto compound can be used in the form of a mercapto silver (silver salt).

These compounds are generally used in an amount of $10^7$ to 1 mol based on 1 mol of the silver halide.

[Development stopping agent]

The development stopping agent can be used in the light-sensitive material to obtain a clear image constantly regardless of the temperature and time for the development process. The development stopping agent can be a compound having a function of neutralizing a base or reacting with a base to reduce the base concentration in the layer to stop development. The agent can also be a compound having a function of mutually reacting with silver or a silver salt to suppress development, after the appropriate development. Examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. The development stopping agent is described in Japanese Patent Provisional Publications No. 62(1987)-253159, No. 2(1990)-42447 and No. 2(1990)-262661.

[Surface active agent]

A surface active agent may be contained in a layer of the light-sensitive material. Various nonionic, anionic, cationic or fluorine surface active agents can be used. The surface active agent is described in Japanese Patent Provisional Publication No. 2(1990)-195356. Sorbitan, polyoxyethylene and a fluorine-containing compound are preferred.

[Matting agent]

A matting agent can be added to a back layer, an overcoating layer or an image formation accelerating layer. The matting agent is well known in the conventional silver halide photography. Inorganic or organic solid particles can be used as the matting agent. The matting agent is usually dispersed in a hydrophilic colloidal binder.

Examples of the inorganic matting agents include oxides (e.g., silicon dioxide, titanium dioxide, magnesium oxide, aluminum oxide), alkali earth metal salts (e.g., barium sulfate, strontium sulfate, magnesium sulfate, potassium carbonate), silver halide particles (which does not form an image) and glass.

Examples of the organic matting agents include starch, cellulose esters, cellulose ethers and synthetic resins. The synthetic resins are preferably not or slightly soluble in water. The synthetic resins can be made from alkyl acrylate, alkyl methacrylate, alkoxyalkyl acrylate, alkoxyalkyl methacrylate, glycidyl acrylate, glycidyl methacrylate, acrylamide, methacrylamide, vinyl ester, acrylonitrile, olefin, styrene and benzoguanamine. The synthetic resin polymer may be in the form of a copolymer. The copolymer can be made from the above-mentioned monomers and the other monomers, such as acrylic acid, methacrylic acid, α,β-unsaturated dicarboxylic acid, hydroxyalkyl acrylate, sulfoalkyl acrylate, sulfoalkyl methacrylate and styrenesulfonic acid.

An epoxy resin, nylon, polycarbonate, a phenol resin, polyvinyl carbazole and polyvinylidene chloride can be used as the matting agent.

The matting agent may be soluble in an alkaline solution. An example of the alkaline-soluble matting agent is alkyl methacrylate-methacrylic acid copolymer, which is described in Japanese Patent Provisional Publications No. 53(1978)-7231, No. 58(1983)-66937, No. 60(1985)-8894. The alkaline-soluble matting agent may have an anionic group, as is described in Japanese Patent Provisional Publication No. 58(1983)-166341.

The average particle size of the matting agent is preferably in the range of 1 to 50 $\mu$m. The particle size distribution may be monodispersed or polydispersed. The maximum particle size of the matting agent is preferably not more than 30 $\mu$m. The particles of not more than 20 $\mu$m is preferably 10 volume % of the total amount of the matting agent.

The amount of the matting agent is preferably in the range of 0.01 to 1 g/m$^2$, and more preferably in the range of 0.1 to 0.7 g/m$^2$.

[Polymerization inhibitor]

A polymerization inhibitor may be added to the polymerizable layer to prevent the dark reaction. Various known polymerization inhibitors can be used. Examples of the polymerization inhibitors include a nitrosoamine, a thiourea, a thioamide, a urea compound, a phenol derivative, a nitrobenzene derivative and an amine. Concrete examples include aluminum salt of cupferron, N-nitrosodiphenylamine, allylthiourea, an aryl phosphate, p-toluidine, φ-toluquinone, nitrobenzene, pyridine, phenothiazine, b-naphthol, naphthylamine, t-butylcatechol, phenothiazine, chloranil, p-methoxyphenol, pyrogallol, hydroquinone and an alkyl or aryl-substituted hydroquinone.

[Exposing step]

The wavelength of the light corresponds to the spectral sensitivity of silver halide. Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser), light emitting diode and cathode-ray tube. The wavelength is usually with in the visible, near ultraviolet and near infrared regions. A X-ray and an electron bean can also be used as the light source. The amount of the exposure is determined by a sensitivity of the silver halide emulsion. The amount is usually in the range of 0.01 to 10,000 ergs/cm$^2$. The light-sensitive material may be exposed to light through a transparent support.

[Developing step]

The light-sensitive material is developed simultaneously with or after the exposing step. The light-sensitive material is preferably heated to develop the silver halide. However, the light-sensitive material can be subjected to a wet development using a developing solution.

The heat development can be conducted by placing the light-sensitive material on a heated material (e.g., metal plate, block, roller). The light-sensitive material may be immersed in a heated liquid for the development. Further, the light-sensitive material may be irradiated with an infrared ray. The surface of the light-sensitive material may be open to the air while heating the material from the side of the support. The surface of the light-sensitive material may be covered with the heating means to prevent the air from penetrating into the layers. In the case that the surface is open to the air, a layer of the light-sensitive material preferably contains a polymer having a function of prevent the air from penetrating into the layers.

The heating temperature is preferably in the range of 60° to 200° C., and more preferably in the range of 100° to 150° C. The heating time is preferably in the range of 1 to 180 seconds, and more preferably in the range of 5 to 60 seconds.

A preheat treatment or post-heat treatment can be conducted before or after the heat development. The temperature of the preheat is lower than the heat development temperature, and the time is shorter than the development time. The post-heat treatment can be conducted after the image is formed, for example after removing the unhardened hardening layer.

In the system wherein the unexposed area is hardened, a thermal polymerization initiator or a photopolymerization initiator is preferably contained in the light-sensitive material. Where a thermal polymerization initiator is used, the initiator can function at the heat development to form an initiator radical uniformly. Where the photopolymerization initiator is used, the light-sensitive material is uniformly exposed to light after the developing step. The light source is determined based on the spectral sensitivity of the photopolymerization initiator. Examples of the light sources are described at the exposing step. The exposure amount is usually in the range of $10^3$ to $10^7$ ergs/cm$^2$.

After the heat development step, a hardened image can be formed. The hardened image is used in various technical fields. If necessary, some post treatment can be applied to the hardened image based on the chemical or physical differences between the hardened area and the unhardened area. The differences relate to solubility, surface adhesion, adhesion to the support, softening point, refraction, permittivity, diffusion character and coloring character. Examples of the post treatment include a removing step, a transferring step, a toning step and a dyeing step.

[Removing step]

The unhardened area can be selectively removed to form a polymer image based on a difference in the solubility between the hardened area and the unhardened area.

After the heat development, the light-sensitive material is immersed in a solvent (an etching solution) to conduct the removing step. An organic solvent, an aqueous alkaline solution and a mixture thereof can be used as the solvent. The solvent should have a function of dissolving or swelling the unhardened area. Examples of the alkaline compound include sodium hydroxide, potassium hydroxide, sodium carbonate, sodium silicate, potassium silicate, sodium metasilicate, potassium metasilicate, sodium phosphate, potassium silicate, ammonia and aminoalcohols (e.g., monoethanolamine, diethanolamine, triethanolamine). An organic solvent is preferably added to an aqueous etching solution. The organic liquid preferably is an alcohol or an ether. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols described above as the alkaline compounds. Examples of the ethers are cellosolves. The solvent may further contain the other additives such as a surface active agent and a defoaming agent. Commercially available developing solutions can also be used. Before the removing step, a light-sensitive layer or other hydrophilic layers may be removed by washing the light-sensitive material with water, or peeling the hydrophilic layers.

The removing step can also be conducted by a sheet based on a difference in the adhesion to the sheet between the hardened area and the unhardened area. The hardened area or the unhardened area is selectively attached to the removing sheet. An image can be formed on the area remaining on the light-sensitive material. The removing sheet can be laminated on the light-sensitive material before the exposing step or the developing step.

[Transferring step]

The obtained image can be transferred to an image receiving material based on a difference in the adhesion to the image receiving material between the hardened area and the unhardened area. The image receiving material can be laminated on the light-sensitive material before the exposing step or the developing step.

[Toning step]

A colored substance (toner) can be attached to the hardened area or the unhardened area. The toner can be selectively attached to the unhardened area based on a difference in the adhesion to the toner between the hardened area and the unhardened area. After the hardened area or the unhardened area is removed, the toner can be attached to the remaining area. Further, the toner can be attached to an adhesive layer, after the hardened area or the unhardened area on the adhesive layer is selectively removed. Furthermore, the toner can be attached to an image receiving material, after the hardened area or the unhardened area is selectively transferred to the image receiving material.

[Dyeing step]

The hardened area or the unhardened area can be selectively dyed to form a visible image. The dyeing step can also be conducted to an image receiving material, after the hardened area or the unhardened area is selectively transferred to the image receiving material.

The obtained image can be used as a printing plate, a color proof, a hard copy or a relief image.

[Other light-sensitive materials]

The aluminum support of the present invention can also be used in various light-sensitive materials other than the above-mentioned silver halide light-sensitive materials (I) to (IV). A representative non silver halide light-sensitive material is a presensitized printing plate comprising an aluminum support and a light-sensitive resin layer.

The light-sensitive resin layer is the same as that described in the light-sensitive material (II).

In the image formation, the presensitized printing plate having a light-sensitive resin layer is imagewise exposed to light to harden the layer within the exposed area (light hardening type) or to decompose the resin within the exposed area (light decomposition type). An image (printing plate) is then formed by removing the unhardened (decomposed) area from the light-sensitive material.

EXAMPLE 1

Preparation of aluminum support

Melts (1) to (6) of aluminum alloys set forth in Table 1 were continuously cast and rolled at a cooling rate of 300° to 1,000° C. per second to form a strip having a thickness of about 6 mm. The strip was subjected to cold rolling operations. The strips made of the melts (2) to (5) were subjected to an intermediate annealing treatment between two cold rolling operations. Thus aluminum sheets (1) to (6) having the thickness of 0.24 mm were prepared.

Independently, melts (A) and (B) of aluminum alloys set forth in Table 1 were discontinuously cast at the cooling rate of 10° C. per second to form a slab having a thickness of about 500 mm. The slab was rounded, and was subjected to a heating and soaking treatment and hot rolling operations to form a strip having a thickness of about 3 mm. The strips were subjected to a cold rolling treatment to the thickness of 1.5 μm, and to an intermediate annealing treatment. The strips were again subjected to a cold rolling treatment. Thus aluminum sheets (A) and (B) having the thickness of 0.24 mm were prepared. The difference between (A) and (B) is the difference in the method of the intermediate annealing treatment (continuous treatment or batch treatment).

Further, a melt (C) of aluminum alloy set forth in Table 1 was continuously cast and rolled at the cooling rate of 80° C. per second to form a strip having a thickness of about 2 mm. The strip was subjected to cold rolling operations and to an intermediate annealing batch treatment. The strip was again subjected to a cold rolling treatment. Thus aluminum sheet (C) having the thickness of 0.24 mm was prepared.

Figure 1:
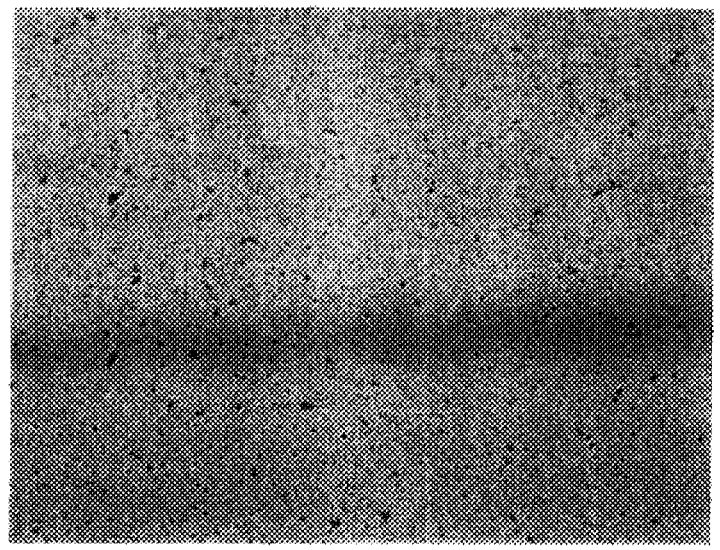
FIG. 1 is a micrograph (magnification: 400×) of the aluminum support (1) of the present invention, the surface of which has been ground, and etched.
Figure 2:
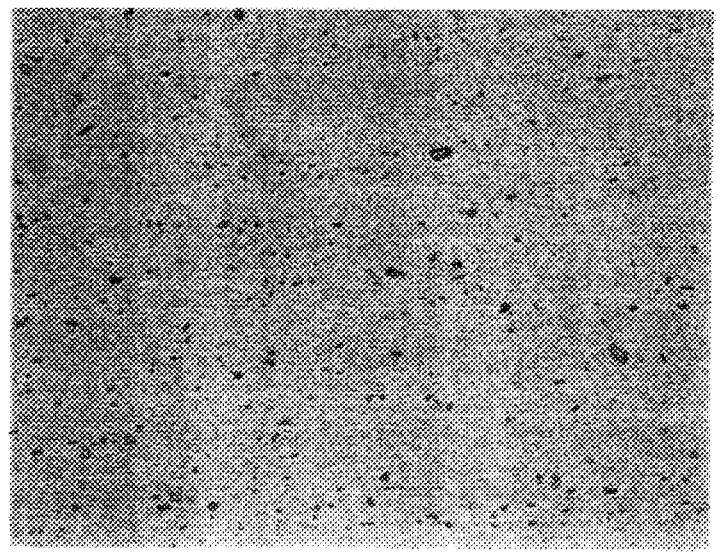
FIG. 2 is a micrograph (magnification: 400×) of the comparative aluminum support (A), the surface of which has been ground, and etched.
Figure 3:
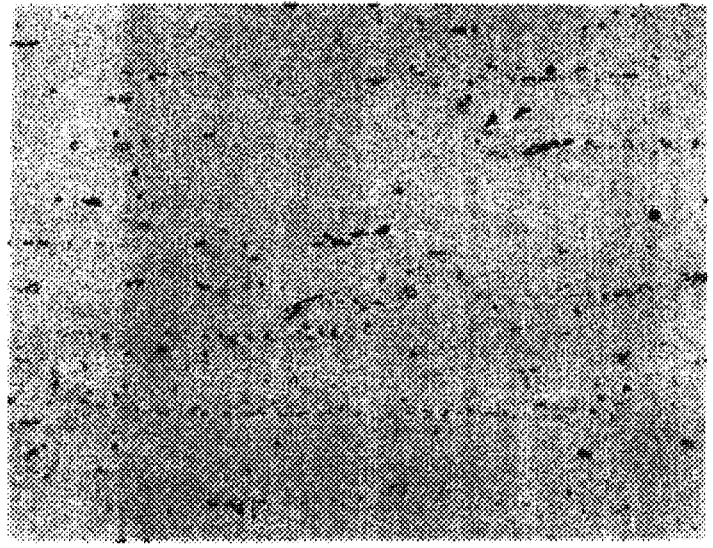
FIG. 3 is a micrograph (magnification: 400×) of the comparative aluminum support (C), the surface of which has been ground, and etched.

The surfaces of the aluminum sheets were polished and etched. The surfaces were photographed through an optical microscope within 10 fields (65 m$^2$) to observe grains of secondary phase. The photographs of the aluminum sheets (1), (A) and (C) are shown in FIGS. 1, 2 and 3, respectively (400×). The maximum grain size was determined from the photographs. The results are set forth in Table 1.

TABLE 1

| Sample No. | Composition of alloy (wt. %) | | | Casting method | Cooling rate |
|---|---|---|---|---|---|
| | Si | Fe | Cu | | |
| (1) | 0.08 | 0.33 | 0.007 | Cont. | 400 |
| (2) | 0.08 | 0.33 | 0.007 | Cont. | 400 |
| (3) | 0.08 | 0.33 | 0.007 | Cont. | 400 |
| (4) | 0.01 | 0.40 | 0.012 | Cont. | 600 |
| (5) | 0.01 | 0.40 | 0.012 | Cont. | 300 |
| (6) | 0.08 | 0.30 | 0.004 | Cont. | 1,000 |
| (A) | 0.08 | 0.33 | 0.007 | Discont. | 10 |
| (B) | 0.08 | 0.33 | 0.007 | Discont. | 10 |
| (C) | 0.08 | 0.30 | 0.004 | Cont. | 80 |

(Remark) Cooling rate: °C. per second

| Sample No. | Annealing treatment | | | Secondary grain size |
|---|---|---|---|---|
| | Method | Temp. | Time | |
| (1) | None | — | — | 2.4 μm |
| (2) | Continuous | 450° C. | 15 seconds | 4.0 μm |
| (3) | Batch | 340° C. | 4 hours | 4.0 μm |
| (4) | Continuous | 450° C. | 15 seconds | 3.2 μm |
| (5) | Continuous | 450° C. | 15 seconds | 4.2 μm |
| (6) | None | — | — | 1.8 μm |
| (A) | Continuous | 450° C. | 15 seconds | 8.0 μm |
| (B) | Batch | 340° C. | 4 hours | 10.2 μm |
| (C) | None | — | — | 7.5 μm |

(Remark) Secondary grain size: Diameter of the largest grain of secondary phase

The surface of the aluminum sheet was ground using a nylon brush and an aqueous suspension of pumice stone of 400 mesh. The sheet was well washed out with water. The aluminum sheet was then immersed for etching in 10% aqueous solution of sodium hydroxide at 70° C. for 60 seconds. The plate was washed out with running water, then neutralized with 20% aqueous solution of nitric acid and washed out with water.

The obtained aluminum sheet was subjected to an electrolytic surface graining treatment in 1% aqueous solution of nitric acid containing 0.5% aluminum nitrate in an anodically electric amount of 160 coulomb/dm$^2$ using sine wave alternating-corrugated current under such conditions as an anodic voltage of 12.7 V and a cathodically electric amount ratio to an anodically electric amount of 0.9. The center line average height (Ra) of the aluminum sheet was 0.6 μm.

The aluminum sheet was immersed in 1% aqueous solution of sodium hydroxide at 40° C. for 30 seconds. The sheet was then immersed in 30% sulfuric acid at 55° C. for 1 minute. Further, the plate was subjected to anodizing treatment in 20% aqueous solution of sulfuric acid at a current density of 2 A/dm$^2$ to form an anodic oxide layer having the thickness of 2.5 g/dm$^2$. The plate was washed with water and dried to obtain an aluminum support.

Preparation of pigment dispersion

The following mixture was stirred in a dynomill dispersing device at 300 rpm for 1 hour at 45° C. to obtain a pigment dispersion having the average particle size of 0.10 μm.

| Pigment dispersion | |
|---|---|
| Pigment (Chromofutal Red A2B) | 18 g |
| Allyl methacrylate/methacrylic acid copolymer (copolymerization ratio = 80/20) | 12 g |
| Cyclohexanone | 30 g |
| Propylene glycol monomethyl ether | 40 g |

Formation of hardening layer

The following coating solution was coated and dried on the support to form a hardening layer having the dry thickness of 1.8 μm.

| Coating solution of hardening layer | |
|---|---|
| Pentaerythritol tetraacrylate | 2.5 g |
| 20 Wt. % propylene glycol monomethyl ether solution of allyl methacrylate/methacrylic acid copolymer (copolymerization ratio = 80/20) | 37.5 g |
| The pigment dispersion | 13.0 g |
| Methyl ethyl ketone | 74.0 g |

Preparation of silver halide emulsion

Gelatin, potassium bromide and water were placed in a vessel, and were adjusted to pH 9.5 at the room temperature by using sodium hydroxide. The following thioether compound (2.0×10$^{-3}$ mol based on the total amount of silver nitrate) was added to the vessel. Further, an aqueous solution of silver nitrate and an aqueous solution of potassium bromide containing a rhodium ammonium chloride (the molar ratio of rhodium to the total amount of potassium iodide and silver nitrate is 2×10$^{-7}$ mol) were added to the vessel according to a pAg controlled double jet method while keeping the pAg of 9.0 in the reaction vessel to prepare a silver iodobromide emulsion. The emulsion was adjusted to pH 6.0 by using sulfuric acid. Further, a potassium bromide solution containing hexachloroiridate(III) salt (the molar ratio of iridium to silver is 5×10$^{-7}$ mol) was twice added to the emulsion at 55° C. and pAg 9.3 according to a double jet method to obtain a core/shell type silver iodobromide emulsion having the following composition.
(Thioether compound)

Core: Silver iodobromide (silver iodide content: 8.5 mol %)

Shell: Pure silver bromide

Core/shell: 3/7 (molar ratio of silver)

Average silver iodide content: 2.55 mol %

Average grain size: 0.30 μm

The grains of the obtained emulsion were monodispersed. In the emulsion, 98% of the grains have a grain size within the range of the average grain size ±40%.

After the emulsion was desalted, a methanol solution of the following sensitizing dyes A and B (A:B=2:1, total amount: $8 \times 10^{-4}$ mol per 1 mol of silver halide) was added to the emulsion. The emulsion was left for 15 minutes. To the emulsion, the following sodium salt of a thiol compound ($6 \times 10^{-4}$ mol per 1 mol of silver halide) was added. The emulsion was stirred for 5 minutes, and was adjusted to pH 6.5 and pAg 8.8 to prepare a silver halide emulsion.

(Sensitizing dye A)

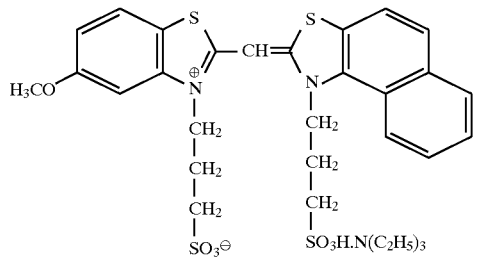

(Sensitizing dye B)

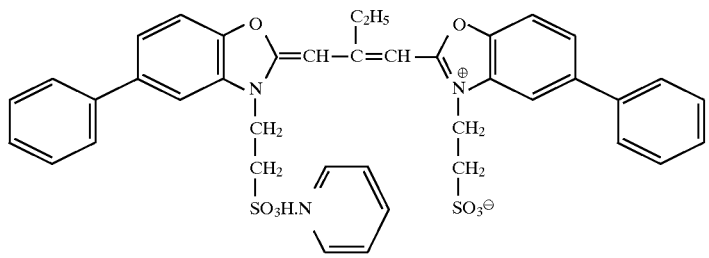

(Sodium salt of thiol)

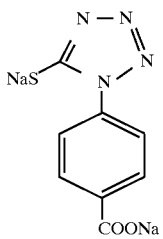

Preparation of reducing agent dispersion

In 750 g of 3 wt. % aqueous solution of polyvinyl alcohol (PVA-205, Kuraray Co., Ltd.), 250 g of powder of the following reducing agent was dispersed using a dynomill dispersing device. The particle size of the reducing agent was not more than about 0.5 μm.

(Reducing agent)

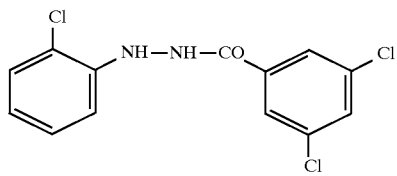

Formation of light-sensitive layer

The following coating solution was coated and dried on the hardening layer to form a light-sensitive layer having the dry coating amount of about 2.0 g/m².

| Coating solution of light-sensitive layer | |
|---|---|
| Polyvinyl alcohol having the saponification degree of 79.5% (PVA-405, Kuraray Co., Ltd.) | 10.5 g |
| 0.11 Wt. % methanol solution of the following compound (SH-1) | 0.41 g |
| 0.11 Wt. % methanol solution of the following compound (SH-2) | 0.41 g |
| The silver halide emulsion | 0.50 g |

-continued

| Coating solution of light-sensitive layer | |
|---|---|
| 5 Wt. % aqueous solution of the following surface active agent | 0.40 g |
| Water | 7.80 g |
| The reducing agent dispersion | 1.20 g |

(SH-1)

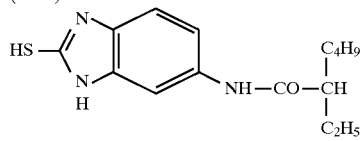

(SH-2)

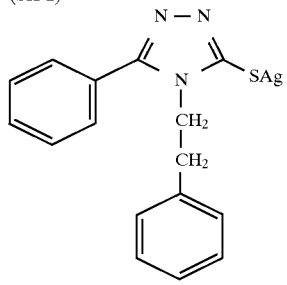

(Surface active agent)

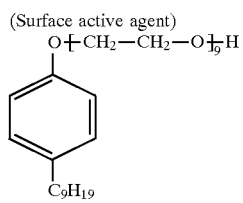

Preparation of base precursor dispersion

In 750 g of 3 wt. % aqueous solution of polyvinyl alcohol (PVA-205, Kuraray Co., Ltd.) was dispersed 250 g of powder of the following base precursor using Dynomill dispersing device. The particle size of the base precursor was not more than about 0.5 µm.

(Base precursor)

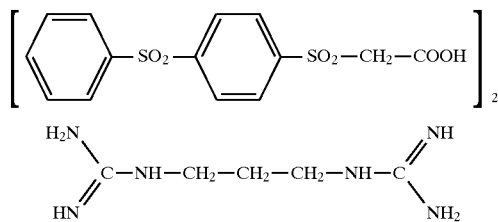

Formation of overcoating layer

The following coating solution was coated and dried on the light-sensitive layer to form an overcoating layer having the dry coating weight of about 4.0 g/m².

| Coating solution of overcoating layer | |
|---|---|
| Polyvinyl alcohol having the saponification degree of 98.5% (PVA-105, Kuraray Co., Ltd.) | 200.0 g |
| The baseprecursor dispersion | 1.25 g |
| 5 Wt. % aqueous solution of the surface active agent | 4.0 g |

Preparation of alkaline solution

The following alkaline solution was prepared and adjusted to pH 13.5.

| Alkaline solution | |
|---|---|
| 28 Wt. % aqueous solution of potassium silicate | 125.0 g |
| Potassium hydroxide | 15.0 g |
| Water | 750.0 g |

Image formation

An original film was placed on the prepared light-sensitive material. The material was exposed to light of 500 nm through a band pass filter using a tungsten lump of 500 W for 1.5 second. The aluminum support of the light-sensitive material was placed on a hot plate while covering the surface of the light-sensitive material with a polyethylene terephthalate film. The material was heated at 140° C. for 50 seconds. As a result, a silver image was observed within the exposed area.

The light-sensitive material was well washed with water to remove the light-sensitive layer and the overcoating layer. The hardening layer was etched with the alkaline solution by a brush in an automatic developing machine to form a clear red polymer relief image on the exposed area of the hardening layer.

The maximum density (Dmax) and the minimum density (Dmin) in the obtained image were evaluated. Further, the polymer spots within the non-image area were evaluated in such a manner that the spots having a diameter of not less than 10 µm were counted within the non-image area of 1 cm². The numbers were classified into five grades, namely zero (0), 1 to 2 (1–2), 3 to 10 (3–10), 11 to 100 (11–100) and 101 or more ($\geq 101$).

The results are set forth in Table 2.

TABLE 2

| Sample No. | Secondary grain size | Image (Printing plate) Dmax | Dmin | Polymer spots |
|---|---|---|---|---|
| (1) | 2.4 µm | 1.53 | 0.33 | 0 |
| (2) | 4.0 µm | 1.55 | 0.33 | 0 |
| (3) | 4.0 µm | 1.52 | 0.33 | 1–2 |
| (4) | 3.2 µm | 1.50 | 0.33 | 0 |
| (5) | 4.2 µm | 1.47 | 0.33 | 1–2 |
| (6) | 1.8 µm | 1.51 | 0.33 | 0 |
| (A) | 8.0 µm | 1.50 | 0.33 | $\geq 101$ |
| (B) | 10.2 µm | 1.51 | 0.33 | $\geq 101$ |
| (C) | 7.5 µm | 1.57 | 0.33 | $\geq 101$ |

(Remark) Secondary grain size: Diameter of the largest grain of secondary phase

EXAMPLE 2

On the aluminum supports (2) to (4), (A) and (C) used in Example 1, the following light-sensitive composition (1) was coated and dried to form a light-sensitive resin layer having the dry coated amount of 2 g/m².

| Light-sensitive composition (1) | |
|---|---|
| Naphthoquinone-1,2-diazido-(2)-5-sulfonic ester of pyrogallol solution in acetone | 5.0 g |
| Cresol-formaldehyde resin | 10.0 g |
| Methyl ethyl ketone | 150 g |
| Cyclohexanone | 122 g |

Further, the following light-sensitive composition (2) was coated on the light-sensitive resin layer at 35° C., and dried to form a silver halide emulsion layer having a dry coated amount of 4.0 g/m².

| Light-sensitive composition (2) | |
|---|---|
| Silver chlorobromide gelatino emulsion (Cl: 70 mol %, Br: 30 mol %, average grain size: 0.28 μm, amount of gelatin per 1 kg of emulsion: 55 g, silver halide content: 0.85 mol) | 1,000 g |
| 0.1 Wt. % methanol solution of 1,3-diethyl-5-[2-(3-(3-sulfopropyl)benzoxazole-2-ylidene)ethylidene]thiohydantoin sodium salt tetraacrylate | 50 ml |
| 0.5 Wt. % alkaline solution of 4-hydroxy-6-methyl-1,3,3a,7-tetrazaindene | 100 ml |
| 2 Wt. % aqueous solution of 2,4-dichloro-6-hydroxy-s-triazine | 35 ml |

An original film was placed on the prepared light-sensitive material. The material was exposed to light using a lump of 100 lux in an exposing machine. The light-sensitive material was developed in an automatic developing machine. In more detail, the light-sensitive material passed through a first developing tank containing the following developing solution (1) at 32° C. for 20 seconds. The material then passed through a fixing tank containing the following fixing solution at the room temperature for 10 seconds. Further, the light-sensitive material was uniformly irradiated with an ultraviolet ray for 15 seconds. The material was immersed in warmed water at 40° to 45° C. and robbed with a brash. The material passed through squeeze rollers, and then passed through a first developing tank containing the following developing solution (2) at 30° C. for 30 seconds to obtain a lithographic plate.

| Developing solution (1) | |
|---|---|
| Water | 350 ml |
| Metol | 1.5 g |
| Sodium sulfite | 22.5 g |
| Hydroquinone | 6.0 g |
| Sodium carbonate monohydrate | 40.0 g |
| Potassium bromide | 1.0 g |
| Water (to make up to) | 3 liter |
| Fixing solution | |
| Water | 350 ml |
| Ammonium thiosulfate | 112 g |
| Sodium sulfite | 10 g |
| Water (to make up to) | 23 liter |
| Developing solution (2) | |
| Sodium silicate (JIS No. 1) | 50 g |
| Sodium metasilicate | 25 g |
| Sodium sulfite | 10 g |
| Pure water | 900 ml |

The image of the obtained printing plate was evaluated in the same manner as in Example 1. The results are set forth in Table 3.

TABLE 3

| Sample No. | Secondary grain size | Image (Printing plate) Dmax | Dmin | Polymer spots |
|---|---|---|---|---|
| (2) | 4.0 μm | 1.22 | 0.31 | 0 |
| (3) | 4.0 μm | 1.32 | 0.30 | 3–10 |
| (4) | 3.2 μm | 1.28 | 0.33 | 1–2 |

TABLE 3-continued

| Sample No. | Secondary grain size | Image (Printing plate) Dmax | Dmin | Polymer spots |
|---|---|---|---|---|
| (A) | 8.0 μm | 1.26 | 0.32 | ≧101 |
| (C) | 7.5 μm | 1.27 | 0.33 | ≧101 |

(Remark) Secondary grain size: Diameter of the largest grain of secondary phase

EXAMPLE 3

On the aluminum supports (2), (3), (A) and (C) used in Example 1, a silver sol (prepared according to a Carey Lea method) was coated to form a physical development nucleating layer. The dry coating amount was 5 mg/m² in terms of silver. Further, a silver chlorobromide emulsion (silver salt/gelatin=1/1) was coated on the physical development nucleating layer to form a silver halide emulsion layer. The silver chlorobromide emulsion comprises 40 mol % of chloride and 60 mol % of bromide. The average grain size of the emulsion was 0.3 μm. The coated amount of the emulsion was 2.0 g/m².

The prepared light-sensitive material was imagewise exposed to light in the same manner as in Example 1. The light-sensitive material was treated with the following developing solution (1) at 25° C. for 30 seconds to form an image. The image (printing plate) was evaluated in the same manner as in Example 1. The results are set forth in Table 4.

| Developing solution (3) | |
|---|---|
| Hydroquinone | 10.7 g |
| Sodium sulfite | 44.8 g |
| Sodium hydroxide | 10.8 g |
| 1-Phenyl-4-methyl-3-pyrazolidone | 5.4 g |
| Potassium bromide | 1.0 g |
| Sodium thiosulfate | 8.9 g |
| Water (to make up to) | 1 liter |
| pH | 12 to 13 |

TABLE 4

| Sample No. | Secondary grain size | Image (Printing plate) Dmax | Dmin | Polymer spots |
|---|---|---|---|---|
| (2) | 4.0 μm | 1.37 | 0.36 | 1–2 |
| (3) | 4.0 μm | 1.39 | 0.37 | 0 |
| (A) | 8.0 μm | 1.45 | 0.35 | ≧101 |
| (C) | 7.5 μm | 1.32 | 0.38 | ≧101 |

(Remark) Secondary grain size: Diameter of the largest grain of secondary phase

We claim:

1. A silver halide light-sensitive material comprising an aluminum alloy support and a silver halide light-sensitive layer, said aluminum alloy support containing grains of secondary phase, wherein the maximum grain size of the grains of secondary phase essentially is less than 5 μm.

2. A silver halide light-sensitive material comprising an aluminum alloy support, a light-sensitive resin layer and a silver halide light-sensitive layer in the order, said aluminum alloy support containing grains of secondary phase, wherein the maximum grain size of the grains of secondary phase essentially is less than 5 μm.

3. A silver halide light-sensitive material comprising an aluminum alloy support, a silver halide light-sensitive layer and a physical development nucleating layer, said aluminum alloy support containing grains of secondary phase, wherein the maximum grain size of the grains of secondary phase essentially is less than 5 µm.

4. A silver halide light-sensitive material comprising an aluminum alloy support and a silver halide light-sensitive hardening layer containing silver halide, a reducing agent, an ethylenically unsaturated polymerizable compound or an ethylenically unsaturated cross-linkable polymer, said aluminum alloy support containing grains of secondary phase, wherein the maximum grain size of the grains of secondary phase essentially is less than 5 µm.

5. The silver halide light-sensitive material as claimed in claim 4 wherein the silver halide light-sensitive hardening layer comprises a hardening layer and a light-sensitive layer, said hardening layer containing the ethylenically unsaturated polymerizable compound or the ethylenically unsaturated cross-linkable polymer, said light-sensitive layer containing the silver halide, and said reducing agent being contained in the hardening layer or the light-sensitive layer.

6. The silver halide light-sensitive material as claimed in claim 5 wherein the light-sensitive material comprises the aluminum alloy support, the hardening layer and the light-sensitive layer in the order.

7. The silver halide light-sensitive material as claimed in claim 4 wherein the silver halide light-sensitive hardening layer further contains a base precursor.

8. The silver halide light-sensitive material as claimed in claim 6 wherein the light-sensitive material further comprises an overcoating layer containing a base precursor provided on the light-sensitive layer.

9. The silver halide light-sensitive material as claimed in claim 5 wherein the light-sensitive layer further contains a polyvinyl alcohol having a saponification degree of not less than 80%.

10. The light-sensitive material as claimed in claim 8, wherein the overcoating layer further contains a polyvinyl alcohol having a saponification degree of not less than 80%.

* * * * *